(12) United States Patent
Na et al.

(10) Patent No.: US 10,147,743 B2
(45) Date of Patent: Dec. 4, 2018

(54) NON-QUADRANGULAR DISPLAY

(71) Applicant: Samsung Display Co., Ltd., Yongin-si, Gyeonggi-do (KR)

(72) Inventors: Ji Su Na, Yongin-si (KR); Seung-Kyu Lee, Asan-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 392 days.

(21) Appl. No.: 15/147,686

(22) Filed: May 5, 2016

(65) Prior Publication Data

US 2016/0329350 A1    Nov. 10, 2016

(30) Foreign Application Priority Data

May 8, 2015 (KR) .................. 10-2015-0064618

(51) Int. Cl.
*H05K 5/00* (2006.01)
*H01L 27/12* (2006.01)
*H01L 27/32* (2006.01)
*G09G 3/00* (2006.01)
*G02F 1/1362* (2006.01)

(52) U.S. Cl.
CPC ............. *H01L 27/124* (2013.01); *G09G 3/00* (2013.01); *H01L 27/3265* (2013.01); *H01L 27/3276* (2013.01); *G02F 1/136286* (2013.01); *G02F 2201/56* (2013.01)

(58) Field of Classification Search
CPC ...................................................... H01L 27/124
See application file for complete search history.

(56) References Cited

U.S. PATENT DOCUMENTS

| 6,842,164 B2 * | 1/2005 | Imajo | G02F 1/13452 |
| | | | 345/204 |
| 2016/0217740 A1 * | 7/2016 | Lee | G09G 3/3258 |
| 2018/0108677 A1 * | 4/2018 | Yeh | H01L 27/1262 |

FOREIGN PATENT DOCUMENTS

| JP | 2009-069768 A | 4/2009 |
| JP | 2009-679768 A | 4/2009 |
| KR | 10-2007-0026529 A | 3/2007 |
| WO | WO 02/50605 A1 | 6/2002 |

* cited by examiner

Primary Examiner — Stephen W Jackson

(57) ABSTRACT

A non-quadrangular display is disclosed. In one aspect, the display includes a plurality of first signal lines formed in a non-quadrangular display area and a DC voltage line formed in a peripheral area surrounding the non-quadrangular display area. At least one of the first signal lines crosses the DC voltage line in the peripheral area.

20 Claims, 4 Drawing Sheets

NON-QUADRANGULAR DISPLAY

CROSS-REFERENCE TO RELATED APPLICATION

This application claims priority from Korean Patent Application No. 10-2015-0064618 filed on May 8, 2015, which is hereby incorporated by reference for all purposes as if fully set forth herein.

BACKGROUND

Field

The described technology generally relates to a non-quadrangular display.

Description of the Related Technology

A matrix of pixels connected to gate lines and data lines are typically formed on a display panel. A plurality of scan signals are supplied through the gate lines, and data signals are supplied through the data lines.

A non-quadrangular display, for example, a circular display having a circular display unit, includes data lines arranged in parallel to each other. Typically, the data lines are arranged parallel to one of the chords of the circular display unit. Therefore, the lengths of the data lines vary and thus, different numbers of pixels are connected to each of the data lines.

Therefore, a data line at the center of the display unit has more connected pixels and is longer than a data line at an edge of the display unit. Parasitic capacitance of the data line at the center of the display unit is accordingly greater than parasitic capacitance of the data line at the edge thereof.

Hence, when a data signal with the same value is applied to the data line provided in the center of the display unit and the data line provided at the edge, voltage values transmitted to the pixels connected to the data lines are different. That is, when a data signal with the same value is applied to the data line, luminance among pixels because of capacitance differences in the data lines.

Therefore, a non-quadrangular display for implementing constant capacitance values of data lines with different lengths is desired.

The above information disclosed in this Background section is only to enhance the understanding of the background, and therefore it can contain information that does not constitute the prior art that is already known in this country to a person of ordinary skill in the art.

SUMMARY OF CERTAIN INVENTIVE ASPECTS

One inventive aspect relates to a non-quadrangular display for reducing luminance deviation among pixels.

Another aspect is a non-quadrangular display for reducing an area of a bezel region of a display panel of a non-quadrangular display.

Another aspect is a non-quadrangular display including: a plurality of first signal lines formed in a non-quadrangular display area and formed in a first direction; and a DC voltage line formed in a peripheral area of the non-quadrangular display area, wherein at least one of the plurality of first signal lines crosses the DC voltage line in the peripheral area.

The non-quadrangular display can further include a plurality of electrodes formed corresponding to the plurality of first signal lines in the peripheral area.

The plurality of first signal lines can be formed on a first layer, the DC voltage line can be formed on a second layer, and the first layer can be different from the second layer.

The electrode can be formed on a third layer, and the third layer can be different from the first and second layers.

The first layer can be formed on the second layer and the second layer can be formed on the third layer.

An insulating layer can be formed between the first layer and the second layer and between the second layer and the third layer.

Holes for exposing the plurality of electrodes can be formed over the DC voltage line.

The plurality of first signal lines can be connected to corresponding electrodes through corresponding holes.

First terminals of a plurality of first signal lines connected to the corresponding electrodes can be formed to have substantially the same area as an area of the corresponding electrode.

The electrodes can be formed to have different areas depending on a length of the corresponding first signal line.

The electrodes can be formed to have different areas along a circumference of the non-quadrangular display area.

Another aspect is a non-quadrangular display, comprising: a plurality of first signal lines formed in a non-quadrangular display area; and a DC voltage line formed in a peripheral area surrounding the non-quadrangular display area, wherein at least one of the first signal lines crosses the DC voltage line in the peripheral area.

The above non-quadrangular display further comprises a plurality of electrodes formed in the peripheral area, wherein each electrode corresponds to one of the first signal lines in the peripheral area.

In the above non-quadrangular display, the first signal lines are formed on a first layer, wherein the DC voltage line is formed on a second layer, wherein the first layer is different from the second layer.

In the above non-quadrangular display, the electrode is formed on a third layer, wherein the third layer is different from the first and second layers.

In the above non-quadrangular display, the first layer is formed on the second layer, wherein the second layer is formed on the third layer.

The above non-quadrangular display further comprises an insulating layer interposed between the first and second layers and between the second and third layers.

In the above non-quadrangular display, at least a portion of each of the electrodes is exposed by a hole formed over the DC voltage line.

In the above non-quadrangular display, the first signal lines are electrically connected to corresponding electrodes via the corresponding hole.

In the above non-quadrangular display, each of the first signal lines includes a first terminal electrically connected to the corresponding electrodes, wherein the first terminal has substantially the same area as the corresponding electrode.

In the above non-quadrangular display, the electrodes have different areas based on the length of the corresponding first signal line.

In the above non-quadrangular display, the electrodes have different areas along a circumference of the non-quadrangular display area.

In the above non-quadrangular display, the non-quadrangular display area has a substantially circular shape.

Another aspect is a non-quadrangular display, comprising: a data line formed in a display area and substantially parallel to each other; and a DC voltage line including i) a peripheral DC voltage line formed in a peripheral area surrounding the display area and ii) a plurality of center DC voltage lines electrically connected to the peripheral DC voltage line, wherein at least one of the data line crosses the peripheral DC voltage line.

In the above non-quadrangular display, the data line and the center DC voltage lines extend parallel to one another.

The above non-quadrangular display further comprises: a substrate formed in the display and non-display areas; and a first gate electrode interposed between the substrate and the data line.

The above non-quadrangular display further comprises: a second gate electrode interposed between the first gate electrode and the data line; and a first insulating layer interposed between the first and second gate electrodes, wherein the first and second gate electrodes and the first insulating layer form a first capacitor.

The above non-quadrangular display further comprises a second gate insulating layer interposed between the data line and the second gate electrode, wherein the data line, the gate insulating layer and the second gate electrode form a second capacitor.

The above non-quadrangular display further comprises the widths of the data line and an adjacent center DC voltage line are different.

The above non-quadrangular display further comprises the width of the data line is less than the width of the adjacent center DC voltage line.

The above non-quadrangular display further comprises the non-quadrangular display area has a substantially circular shape.

According to at least one of the disclosed embodiments, a wide display area can be provided.

Further, luminance deviation among pixels can be improved.

DETAILED DESCRIPTION OF CERTAIN INVENTIVE EMBODIMENTS

Figure 1:
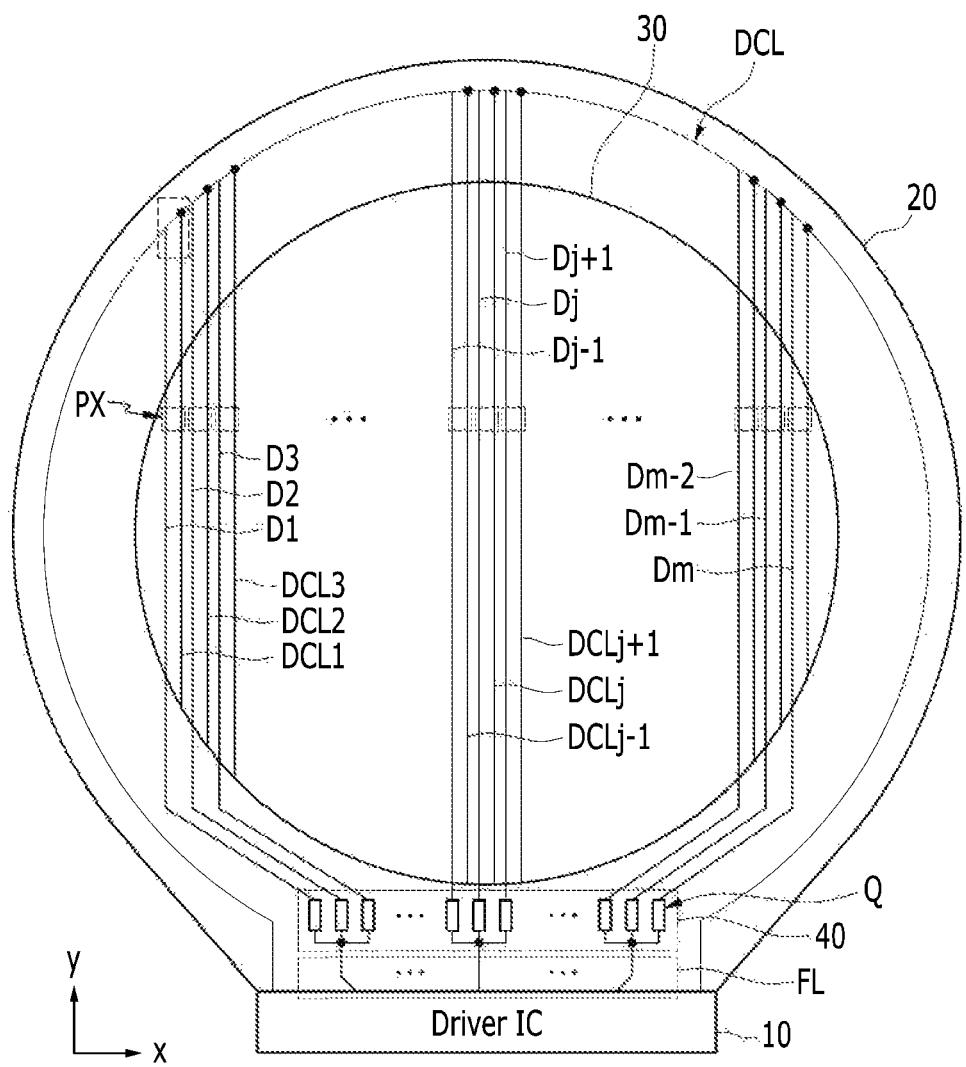
FIG. 1 shows a portion of a configuration of a display according to an exemplary embodiment.

Hereinafter, exemplary embodiments disclosed in the present specification will be described in detail with reference to the accompanying drawings. In the present specification, the same or similar components will be denoted by the same or similar reference numerals, and an overlapping description thereof will be omitted. The terms "module" and "unit" for components are used for ease of description in the following description. Therefore, these terms do not have meanings or roles that distinguish them from each other by themselves. In describing exemplary embodiments of the present specification, when it is determined that a detailed description of the well-known art associated with the described technology can obscure the gist, it will be omitted. The accompanying drawings are provided only in order to allow exemplary embodiments disclosed in the present specification to be easily understood and are not to be interpreted as limiting the spirit disclosed in the present specification, and it is to be understood that the described technology includes all modifications, equivalents, and substitutions without departing from the scope and spirit.

Terms including ordinal numbers such as first, second, and the like, will be used only to describe various components, and are not interpreted as limiting these components. The terms are only used to differentiate one component from other components.

It is to be understood that when one component is referred to as being "connected" or "coupled" to another component, it can be connected or coupled directly to another component or be connected or coupled to another component with the other component intervening therebetween. On the other hand, it is to be understood that when one component is referred to as being "connected or coupled directly" to another component, it can be connected to or coupled to another component without the other component intervening therebetween.

Singular forms are to include plural forms unless the context clearly indicates otherwise.

It will be further understood that terms "comprises" or "have" used in the present specification specify the presence of stated features, numerals, steps, operations, components, parts, or a combination thereof, but do not preclude the presence or addition of one or more other features, numerals, steps, operations, components, parts, or a combination thereof. In this disclosure, the term "substantially" includes the meanings of completely, almost completely or to any significant degree under some applications and in accordance with those skilled in the art. Moreover, "formed on" can also mean "formed over." The term "connected" can include an electrical connection.

FIG. 1 shows a portion of a configuration of a display according to an exemplary embodiment.

Referring to FIG. 1, a plurality of first signal lines (D1-Dm) and a plurality of DC voltage lines (or center DC voltage lines) DCL1-DCLm are formed on a non-quadrangular display panel 20. The DC voltage lines DCL1-DCLm are connected to a DC voltage line (DCL) to receive the same DC voltage.

A plurality of first signal lines D1-Dm are formed in a y-axis direction and arranged in an x-axis direction, and are connected to a driver IC 10. The DC voltage lines DCL1-DCLm are formed in the y-axis direction and arranged in the x-axis direction, and are connected to a driver IC 10. The DC voltage lines DCL1-DCLm can be formed in the x-axis direction to be arranged in the y-axis direction, and can be formed in a mesh structure.

The first signal lines D1-Dm can be a plurality of data lines for transmitting a plurality of data signals. One corresponding DC voltage line of the DC voltage lines DCL1-DCLm is provided near the data line.

The first signal lines D1-Dm are connected to a demultiplexer 40 including a plurality of switching elements Q and receive a corresponding data signal.

The switching element Q includes a first terminal connected to the corresponding data line and a second terminal connected to the driver IC 10. The switching element Q can be turned on according to a level of a clock signal transmitted to a gate.

The driver IC 10 can be connected to the switching elements Q through fan-out lines FL to apply a data signal. For example, the driver IC 10, in synchronization with the clock signal, outputs data signals corresponding to a red pixel, a green pixel, and a blue pixel through a fan-out line. The fan-out line is connected to three switching elements Q. Each of the three switching elements is connected to a corresponding data line. The three data lines are connected to the red pixel, the green pixel, and the blue pixel. The data signal corresponding to the red pixel is applied to the switching elements Q from the driver IC 10. When the level of the clock signal corresponding to the red pixel is changed, the corresponding switching element Q is turned on and the data signal is transmitted to the red pixel through the data line.

The pixels PX have been described as the red (R) pixel, the green (G) pixel, and the blue (B) pixel. However, the pixels PX can uniquely express one of three primary colors, such as red, green, and blue, or yellow, cyan, and magenta.

The first signal lines D1-Dm can extend to the non-display area in which the DC voltage lines DCL1-DCLm are connected to a peripheral DC voltage line DCL. The first signal lines D1-Dm can cross the peripheral DC voltage line DCL.

In this case, a first layer on which the first signal lines (D1-Dm) and the DC voltage lines DCL1-DCLm are formed is different from a second layer on which the peripheral DC voltage line (DCL) is formed. The first layer can be formed on the second layer and an insulating layer can be provided between the first layer and the second layer, and vice versa.

A circular display panel is shown as an example of the non-quadrangular display panel 20 in FIG. 1. However, the described technology is not limited thereto. The display panel 20 can be provided in a random shape. For example, the random shape can be a circle, an oval, a polygon part of which is circular, and a polygon other than a quadrangle. The random shape includes a shape of which a part is curved.

The display panel 20 can be a flexible display panel. The display panel 20 can also be a curved display panel of which part is a curve.

A plurality of pixels PX driven by a signal supplied by one of the first signal lines (D1-Dm) and a DC voltage supplied by one of the DC voltage lines (DCL1-DCLm) can be formed on the display unit 30 of the display panel 20.

For example, a pixel row shown by a box formed with a plurality of dotted lines is shown in a center of FIG. 1. Although the pixel row is shown, it is an example showing a region in which a pixel can be formed, and an exemplary embodiment is not limited thereto. That is, a plurality of pixels in various shapes can be formed on the display unit 30.

Figure 2:
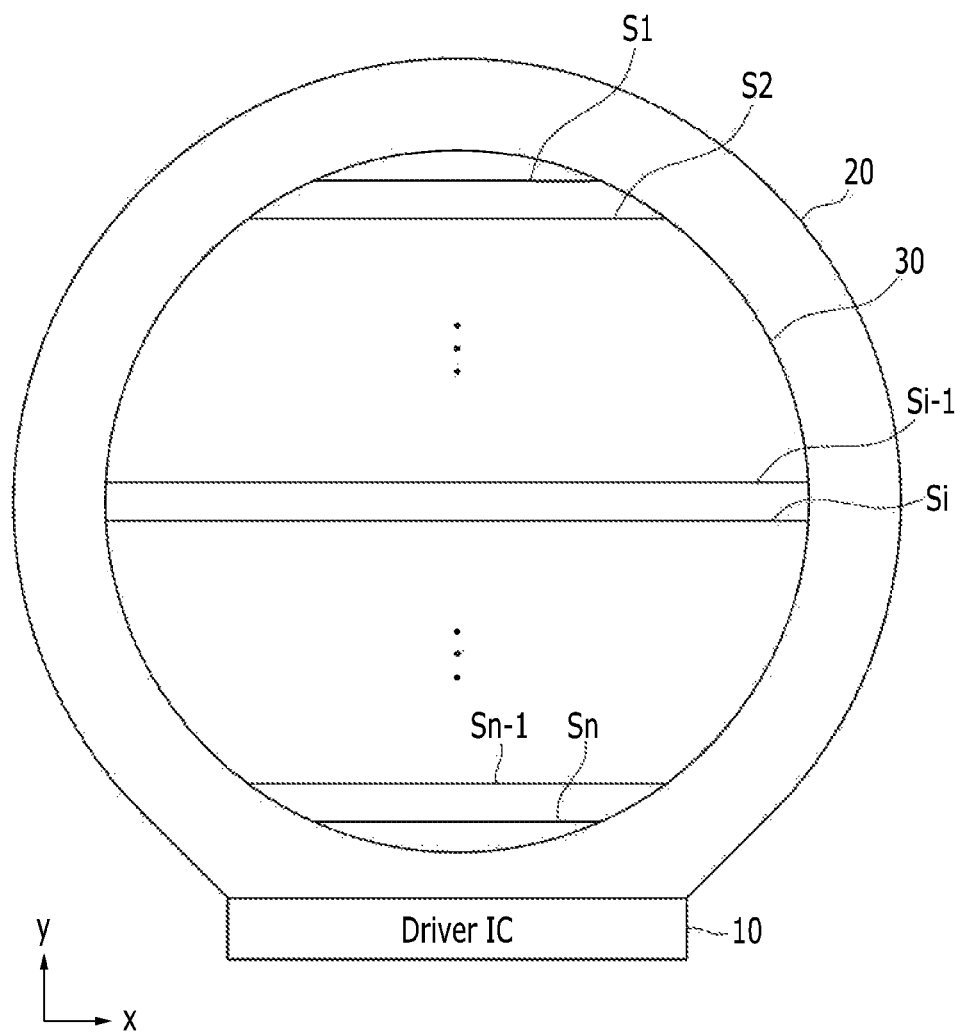
FIG. 2 shows another portion of a configuration of a display, not shown in FIG. 1, according to an exemplary embodiment.

FIG. 2 shows another part of a configuration of a display, not shown in FIG. 1, according to an exemplary embodiment.

In FIG. 2, a plurality of second signal lines (S1-Sn) are formed in the display panel 20. A plurality of second signal lines (S1-Sn) cross a plurality of first signal lines (D1-Dm) described with reference to FIG. 1 in the display unit 30. A corresponding pixel can be formed in a crossing region. A plurality of pixels PX can be connected to a corresponding one of a plurality of second signal lines (S1-Sn). The second signal lines (S1-Sn) can transmit a plurality of scan signals.

FIG. 2 shows a plurality of second signal lines (S1-Sn), but the described technology is not limited thereto.

Figure 3:
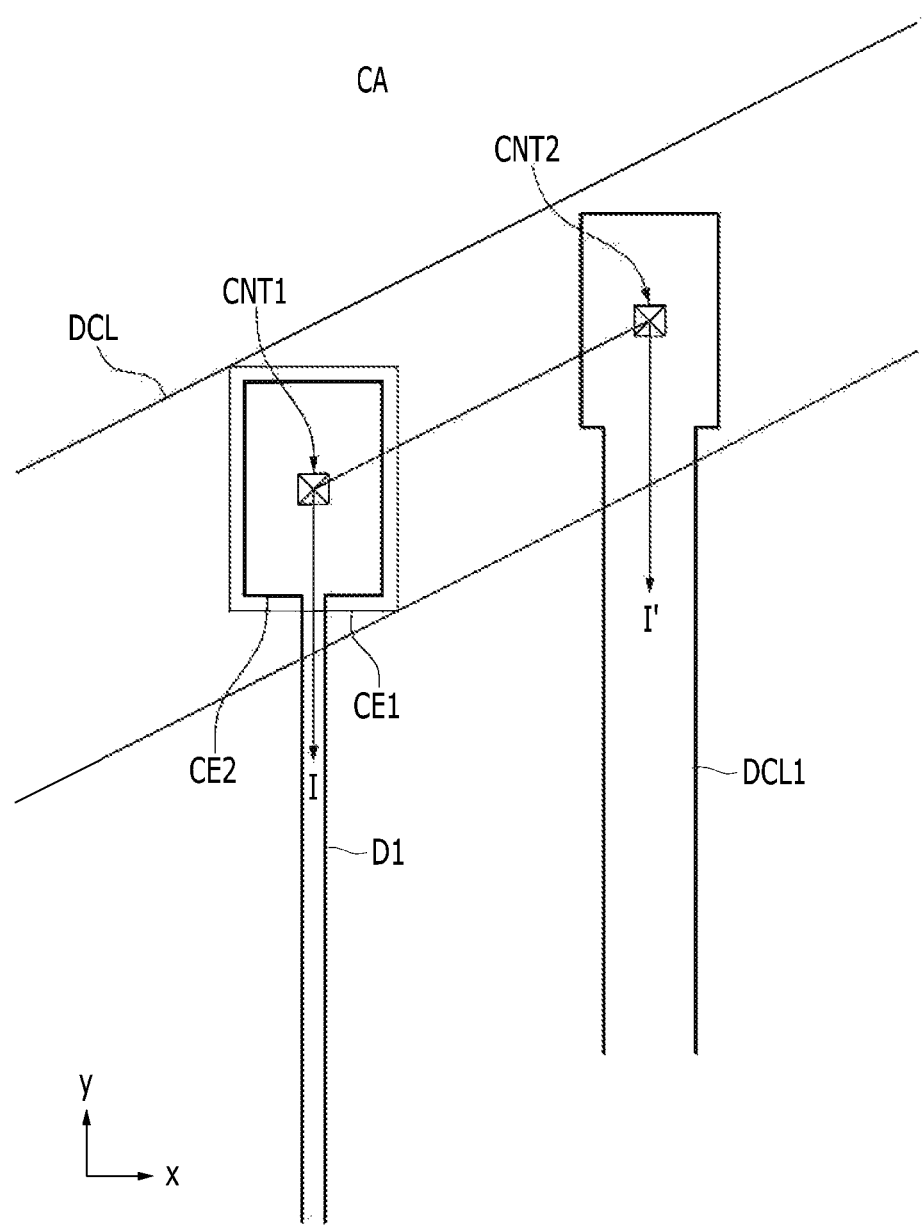
FIG. 3 shows a portion of a non-display area of a display according to an exemplary embodiment.

FIG. 3 shows portion of a non-display area (or peripheral area) CA of a display according to an exemplary embodiment. A DC voltage line (DCL) is formed in a non-display area of a circular display panel 20.

As shown in FIG. 1, a first signal line D1 and a DC voltage line DCL1 extend to a DC voltage line (DCL) of the non-display area and are formed on a first layer.

The DC voltage line DCL1 formed on the first layer is connected to the DC voltage line (DCL) formed on the second layer through a contact hole CNT2.

The first signal line D1 formed on the first layer is connected to an electrode CE1 formed on a third layer through a contact hole CNT1. The third layer is formed at a lower portion of the second layer, and an insulating layer can be provided between the third layer and the second layer.

Corresponding to the contact hole CNT1, the DC voltage line (DCL) has a hole with a predetermined area. Accordingly, the first signal line contacts an electrode CE1 formed on the third layer through the contact hole CNT1 and is insulated from a DC voltage line (DCL) formed on the second layer by an insulating layer. An electrode CE2 of the first signal line D1 and the electrode CE1 formed on the third layer are formed to have substantially the same area.

Although not shown, the electrode CE1 can be formed to have a different area depending on a length of the first signal lines (D1-Dm). For example, the first signal line D1 is shorter than the first signal line D2 and has fewer connected pixels. Therefore, parasitic capacitance of the first signal line D1 is less than the parasitic capacitance of the first signal line D2.

Hence, an electrode connected to the first signal line D1 can be formed to be wider than an electrode connected to the first signal line D2. Accordingly, the sum of the capacitance formed by an electrode connected to the first signal line D2 and the parasitic capacitance of the first signal line D2 and the sum of the capacitance formed by an electrode connected to the first signal line D1 and parasitic capacitance of the first signal line D1 can have substantially the same value.

Further, an area of an electrode connected to the first signal line D1 is determined so that the sum of the capacitance formed by an electrode connected to the first signal line D1 and parasitic capacitance of the first signal line D1 can have substantially the same value as parasitic capacitance of the first signal line (Dj) in a center region.

This can be applied to other first signal lines (D2-Dj−1, Dj+1-Dm). Therefore, the total capacitance formed by the first signal lines (D1-Dm) can have substantially the same value.

The non-display area shown in FIG. 3 will be described in detail with reference to FIG. 4.

Figure 4:
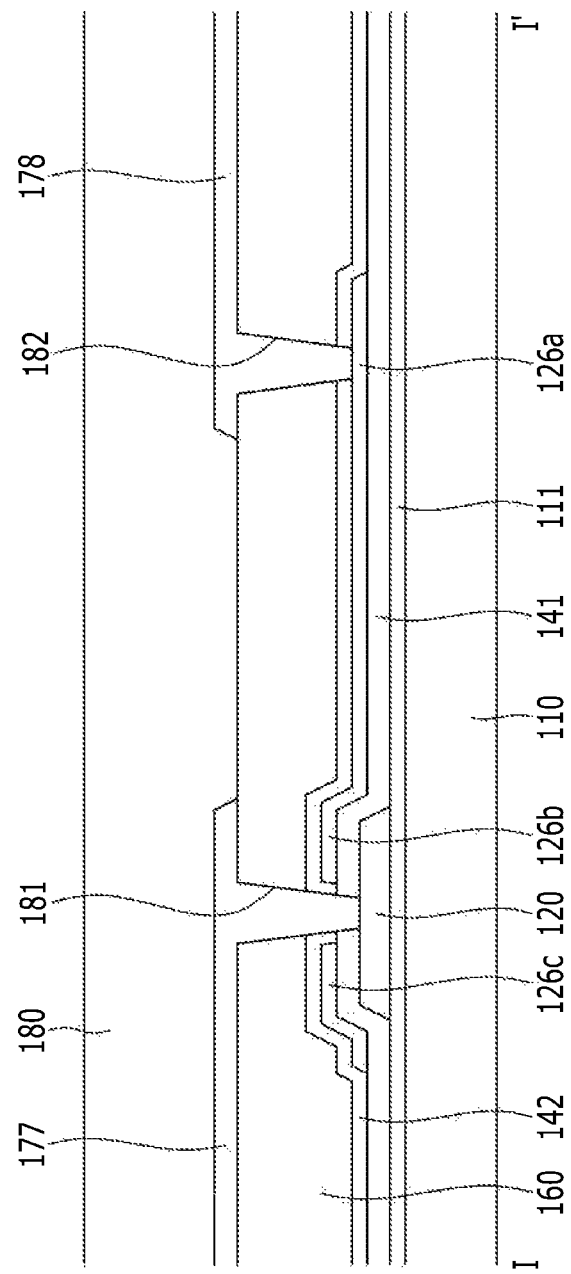
FIG. 4 shows a cross-sectional view of a non-display area with respect to line I-I' of FIG. 3.

FIG. 4 shows a cross-sectional view of a non-display area with respect to a line I-I' of FIG. 3. As shown, a buffer layer 111 is formed on a substrate 110. The substrate 110 includes an insulating substrate formed of glass, quartz, ceramic, or plastic.

A first gate electrode layer 120 including an electrode CE1 is formed on the buffer layer 111.

A first gate insulating layer 141 formed of silicon nitride (SiNx) or silicon oxide (SiO2) is formed on the first gate electrode layer 120.

Second gate electrode layers 126*a*, 126*b*, and 126*c* are formed on the first gate insulating layer 141. The second gate electrode layer 126*b* and the second gate electrode layer 126*c* can be separated from each other by a predetermined interval so as to reveal part of the first gate electrode layer 120.

The second gate electrode layers 126*a*, 126*b*, and 126*c* and the first gate insulating layer 141 are covered by a second gate insulating layer 142. The second gate insulating layer 142 is formed of silicon nitride (SiNx) or silicon oxide (SiO2).

An interlayer insulating layer 160 is formed on the second gate insulating layer 142. The first gate insulating layer 141, the second gate insulating layer 142, and the interlayer insulating layer 160 have a contact hole 181 exposing a part of the first gate electrode layer 120. Further, the second gate insulating layer 142 and the interlayer insulating layer 160 have a contact hole 182 exposing a part of the second gate electrode layer 126a.

The interlayer insulating layer 160 is formed of a ceramic-based material such as silicon nitride (SiNx) or silicon oxide (SiO2) in a like manner as the first gate insulating layer 141 and the second gate insulating layer 142.

A first signal line 177 is connected to part of the first gate electrode layer 120 through the contact hole 181 formed in the interlayer insulating layer 160, the first gate insulating layer 141, and the second gate insulating layer 142.

Further, the DC voltage line 178 is connected to part of the second gate electrode layer 126a through the contact hole 182 formed in the interlayer insulating layer 160 and the second gate insulating layer 142.

A first signal line 177 and a passivation layer 180 for covering the DC voltage line 178 are formed on the interlayer insulating layer 160.

According to the above-described structure, a capacitor is formed between the second gate electrode layers 126b and 126c and the first gate electrode layer 120, and a capacitor is formed between the first signal line 177 and the second gate electrode layers 126b and 126c. As a result, additional capacitance is formed on the first signal line D1. The sum of capacitance formed by an electrode connected to the first signal line D1 and parasitic capacitance of the first signal line D1 can have substantially the same value as parasitic capacitance of the first signal line (Dj) in the center region.

A capacitance deviation between the data line (Dj) in the center of the display unit 30 and the data line D1 at the edge can be reduced. Accordingly, luminance deviation among pixels generated by different length data lines can be reduced.

Further, capacitance is formed by the first gate electrode layer 120, the second gate electrode layers 126b and 126c, and the first signal line 177 so the non-display area can be narrower than when capacitance is formed by two layers (e.g., a first gate electrode layer and a second gate electrode layer). Therefore, according to the exemplary embodiment, a wide display unit 30 can be provided.

While the inventive technology has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A non-quadrangular display, comprising:
a plurality of first signal lines formed in a non-quadrangular display area; and
a DC voltage line formed in a peripheral area surrounding the non-quadrangular display area,
wherein at least one of the first signal lines crosses the DC voltage line in the peripheral area.

2. The non-quadrangular display of claim 1, further comprising a plurality of electrodes formed in the peripheral area, wherein each electrode corresponds to one of the first signal lines in the peripheral area.

3. The non-quadrangular display of claim 2, wherein the first signal lines are formed on a first layer, wherein the DC voltage line is formed on a second layer, and wherein the first layer is different from the second layer.

4. The non-quadrangular display of claim 3, wherein the electrode is formed on a third layer, and wherein the third layer is different from the first and second layers.

5. The non-quadrangular display of claim 4, wherein the first layer is formed on the second layer, and wherein the second layer is formed on the third layer.

6. The non-quadrangular display of claim 5, further comprising an insulating layer interposed between the first and second layers and between the second and third layers.

7. The non-quadrangular display of claim 5, wherein at least a portion of each of the electrodes is exposed by a hole formed over the DC voltage line.

8. The non-quadrangular display of claim 7, wherein the first signal lines are electrically connected to corresponding electrodes via the corresponding hole.

9. The non-quadrangular display of claim 8, wherein each of the first signal lines includes a first terminal electrically connected to the corresponding electrodes, and wherein the first terminal has substantially the same area as the corresponding electrode.

10. The non-quadrangular display of claim 2, wherein the electrodes have different areas based on the length of the corresponding first signal line.

11. The non-quadrangular display of claim 10, wherein the electrodes have different areas along a circumference of the non-quadrangular display area.

12. The non-quadrangular display of claim 1, wherein the non-quadrangular display area has a substantially circular shape.

13. A non-quadrangular display, comprising:
a data line formed in a display area and substantially parallel to each other; and
a DC voltage line including i) a peripheral DC voltage line formed in a peripheral area surrounding the display area and ii) a plurality of center DC voltage lines electrically connected to the peripheral DC voltage line,
wherein at least one of the data line crosses the peripheral DC voltage line.

14. The non-quadrangular display of claim 13, wherein the data line and the center DC voltage lines extend parallel to one another.

15. The non-quadrangular display of claim 14, further comprising:
a substrate formed in the display and non-display areas; and
a first gate electrode interposed between the substrate and the data line.

16. The non-quadrangular display of claim 15, further comprising:
a second gate electrode interposed between the first gate electrode and the data line; and
a first insulating layer interposed between the first and second gate electrodes,
wherein the first and second gate electrodes and the first insulating layer form a first capacitor.

17. The non-quadrangular display of claim 16, further comprising a second gate insulating layer interposed between the data line and the second gate electrode, wherein the data line, the gate insulating layer and the second gate electrode form a second capacitor.

18. The non-quadrangular display of claim 17, wherein the widths of the data line and an adjacent center DC voltage line are different.

19. The non-quadrangular display of claim 18, wherein the width of the data line is less than the width of the adjacent center DC voltage line.

20. The non-quadrangular display of claim 19, wherein the non-quadrangular display area has a substantially circular shape.

* * * * *